(12) United States Patent
Garing et al.

(10) Patent No.: US 9,771,644 B2
(45) Date of Patent: Sep. 26, 2017

(54) METHOD AND APPARATUS FOR PRODUCING DIFFUSION ALUMINIDE COATINGS

(71) Applicants: Kevin E. Garing, Indianapolis, IN (US); Jeffrey J. McConnell, Lyman, ME (US); Carl Hugo Hutzler, III, Indianapolis, IN (US)

(72) Inventors: Kevin E. Garing, Indianapolis, IN (US); Jeffrey J. McConnell, Lyman, ME (US); Carl Hugo Hutzler, III, Indianapolis, IN (US)

(73) Assignee: PRAXAIR S.T. TECHNOLOGY, INC., North Haven, CT (US)

( * ) Notice: Subject to any disclaimer, the term of this patent is extended or adjusted under 35 U.S.C. 154(b) by 257 days.

(21) Appl. No.: 14/534,590

(22) Filed: Nov. 6, 2014

(65) Prior Publication Data

US 2015/0132485 A1    May 14, 2015

Related U.S. Application Data

(60) Provisional application No. 61/901,573, filed on Nov. 8, 2013.

(51) Int. Cl.
| C23C 10/48 | (2006.01) |
| C23C 14/04 | (2006.01) |
| C23C 14/14 | (2006.01) |
| C23C 14/24 | (2006.01) |
| C23C 10/28 | (2006.01) |

(52) U.S. Cl.
CPC ............... *C23C 10/48* (2013.01); *C23C 10/28* (2013.01); *C23C 14/046* (2013.01); *C23C 14/14* (2013.01); *C23C 14/243* (2013.01)

(58) Field of Classification Search
CPC ....... C23C 10/28; C23C 10/48; C23C 14/046; C23C 14/14
USPC ................. 427/237, 250, 252, 253
See application file for complete search history.

(56) References Cited

U.S. PATENT DOCUMENTS

| 3,102,044 | A | 8/1963 | Joseph |
| 3,257,230 | A | 6/1966 | Wachtell et al. |
| 3,544,348 | A | 12/1970 | Boone et al. |
| 5,135,777 | A | 8/1992 | Davis et al. |
| 5,650,235 | A | 7/1997 | McMordie et al. |
| 5,922,409 | A | 7/1999 | McMordie et al. |
| 6,110,262 | A | 8/2000 | Kircher et al. |
| 6,444,054 | B1 | 9/2002 | Kircher et al. |

(Continued)

FOREIGN PATENT DOCUMENTS

| EP | 0644016 A1 | 3/1995 |
| EP | 2060653 A2 | 5/2009 |
| GB | 2414245 A | 11/2005 |

*Primary Examiner* — William Phillip Fletcher, III
(74) *Attorney, Agent, or Firm* — Nilay S. Dalal

(57) ABSTRACT

A method for applying an aluminide coating includes applying an aluminum-based slurry onto an elongated member. The elongate member is introduced through an opening of a component and positioned within a cavity of the component at a location that is spaced apart from the internal surfaces of the component. Heat is applied to generate vaporized aluminum which diffuses into the internal surfaces of the component. Aluminum reacts with the internal surfaces to form an aluminide coating.

20 Claims, 5 Drawing Sheets

(56) References Cited

U.S. PATENT DOCUMENTS 6,730,179 B2 5/2004 Kircher
2011/0045181 A1* 2/2011 Jek .................. C23C 16/045
427/248.1

* cited by examiner

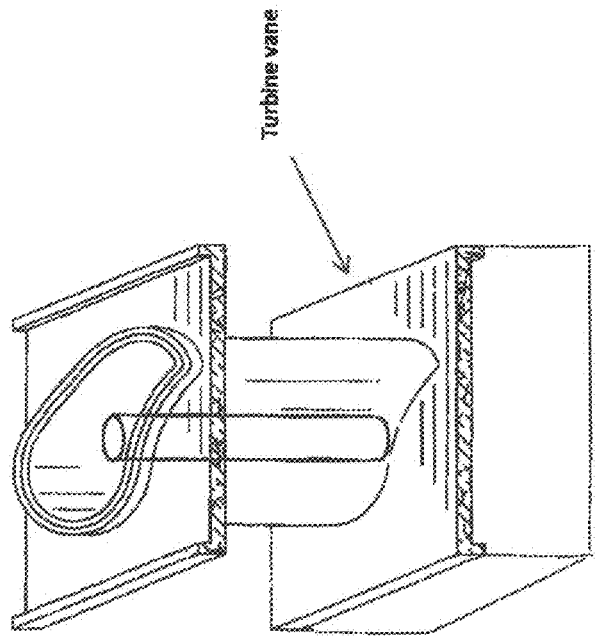
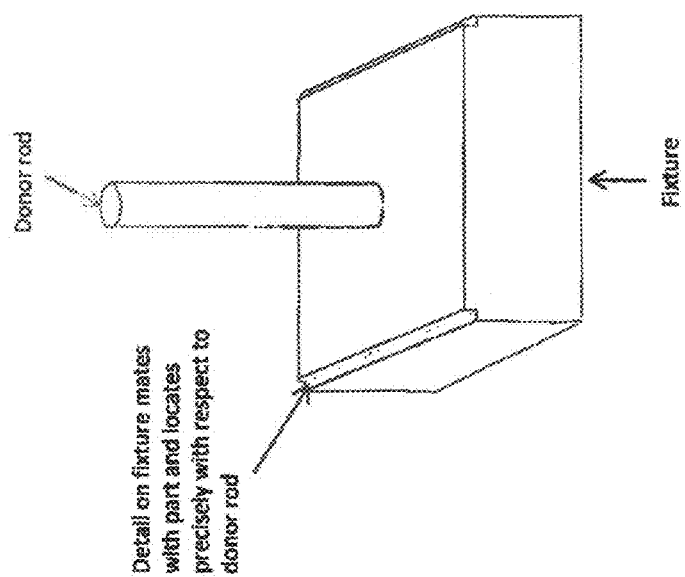
FIG. 2A
FIG. 2B

Four foot length 2" dia SS304 tube
Slurry coated. After processing to remove bisque and scale.
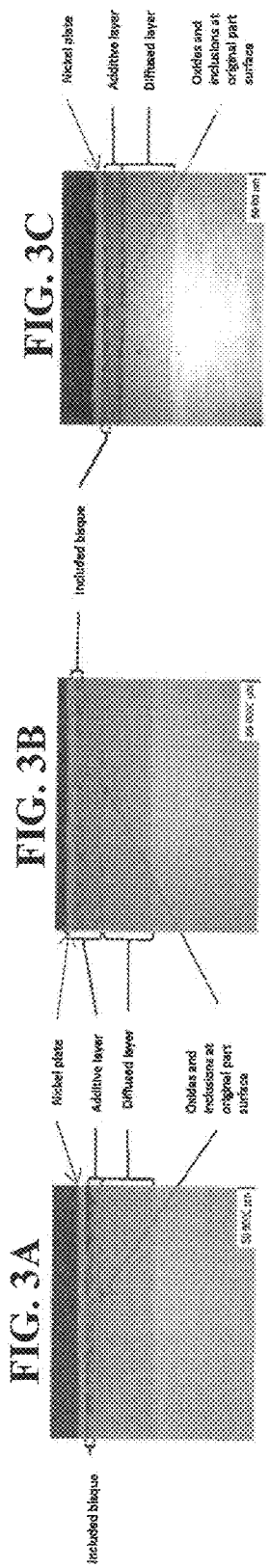
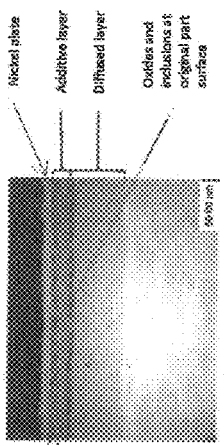
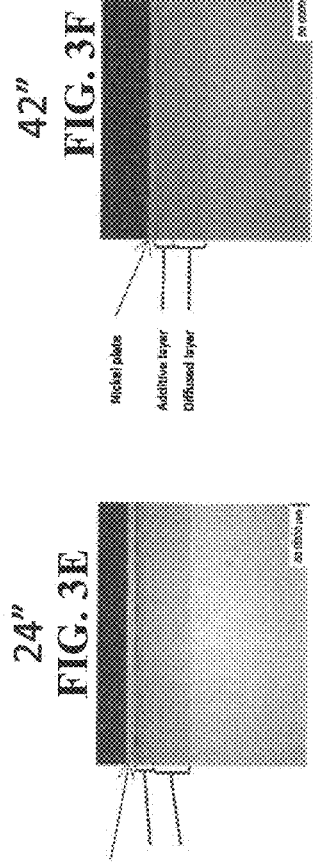
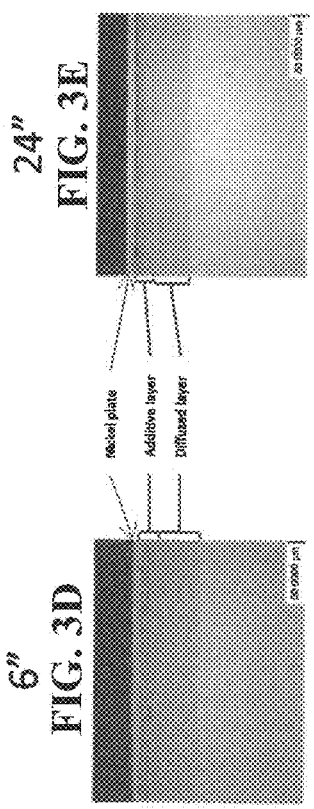
FIG. 3A
FIG. 3B
FIG. 3C
6"
FIG. 3D
24"
FIG. 3E
42"
FIG. 3F
As coated with donor rod

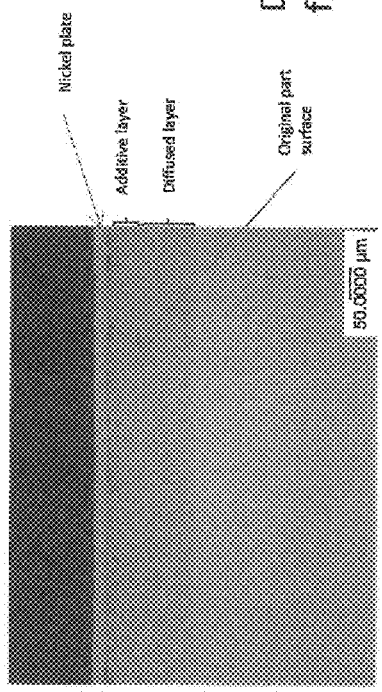

FIG. 4B

Four foot length 2" dia SS304 tube

Nickel plate
Additive layer
Diffused layer
Original part surface

Donor rod coating is immediately out of furnace. No clean up operations.

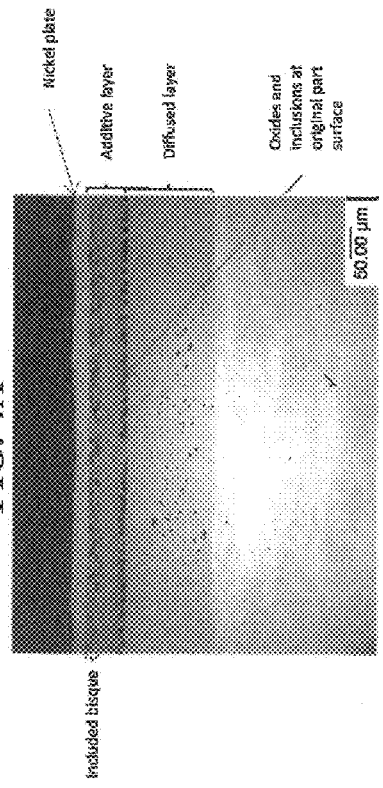

Donor rod coating

FIG. 4A

Nickel plate
Additive layer
Diffused layer
Oxides and inclusions at original part surface Included bisque Slurry coating Slurry coating has been through power wash to remove bisque, chemical neutralization, and mechanical polishing to remove rough scale.

METHOD AND APPARATUS FOR PRODUCING DIFFUSION ALUMINIDE COATINGS

The present application claims priority from U.S. Provisional Application Ser. No. 61/901,573, filed Nov. 8, 2013, which is incorporated by reference herein in its entirety.

FIELD OF THE INVENTION

The present invention relates to novel and improved methods and coating apparatuses for applying a controlled amount of diffusion coating material onto surfaces of an internal cavity, such as the internal sections of gas turbine components.

BACKGROUND OF THE INVENTION

Aluminide coatings are diffused coatings widely used to protect metallic substrate surfaces, such as nickel, cobalt, iron and copper alloys. Aluminide coatings are based on intermetallic compounds formed when nickel and cobalt react with aluminum at the substrate's surface. An intermetallic compound is an intermediate phase in a binary metallic system, having a characteristic crystal structure enabled by a specific elemental (atomic) ratio between the binary constituents.

Aluminum-based intermetallic compounds (i.e., aluminides) are resistant to high temperature degradation. As a result, they have emerged as preferred protective coatings. The protective aluminide coatings provide high temperature oxidation and corrosion protection for various end-use applications. These coatings are particularly effective for protection of aerospace components, such as gas turbines engines.

Gas turbine engines include various components such as blades, vanes and combustor cases. The components are usually made from nickel and cobalt alloys. During operation, these components are typically located in the hot section of the turbine and exposed to the hot gases from the turbine combustion process where oxidation and corrosion can occur. In particular, oxidation and corrosion reactions at the surface of the component parts can cause metal wastage and loss of wall thickness. The loss of metal rapidly increases the stresses on the respective component part and can result in part failure. Aluminide coatings are thus applied to these component parts to protect the structural integrity of the part by providing resistance against oxidation and corrosion.

Careful dimensional tolerances imposed on parts during manufacture must also be maintained during the aluminide coating process. The aluminide coating process involves heating a metallic substrate surface in the presence of an aluminum containing source material. The aluminum-containing source material includes a halide activator and an aluminum "donor" or source alloy. As used herein and throughout the specification, it should be understood that the term "donor" and "source" are used interchangeably. When the material is heated, the donor alloy and activator react to generate an aluminum vapor. The vaporized aluminum transfers to the metallic substrate surface and diffuses into the metal surface creating a protective outer layer of metal aluminum alloy. The aluminum reacts with the substrate to form intermetallic compounds. An additive layer containing the aluminum is also formed.

The aluminide coating process generally involves coating the external and internal sections of a component. One type of aluminide coating is typically used to coat the external surfaces and a second type of aluminide is used to coat the internal section. Uneven or excessively thick diffusion coating layers to the parts can effectively act to reduce wall thickness and hence the part's strength. Furthermore, excessively thick aluminide coatings, especially at leading and trailing edges of turbine blades where high stresses mostly occur, can result in fatigue cracking.

Moreover, the components are typically constructed with hollow core passages for transporting internal cooling air. As a result, the internal surfaces of the hollow components must be coated in a way that not only produces uniform thickness coatings, but leaves unobstructed the cooling air passages along the internal surfaces. Advancements in the aerospace industry have led to gas turbine components which are designed with increasingly complicated geometries along surfaces of the internal cavities, thereby making the ability to uniformly coat such surfaces more challenging than previously encountered.

One technique for the application of aluminide coating onto internal surfaces of the hollow components relies on the direct application of donor and activator to the internal surfaces utilizing a pack of aluminizing powder. The pack technique involves utilizing aluminum powder, which is mixed with an activator such as aluminum fluoride or ammonium fluoride. The part to be coated is immersed into this powder with the activator in a manner to ensure the part is completely surrounded by the aluminum-based powder. The aluminum-based powder is also forced into the internal sections of the part, and thereafter heated to melt and diffuse the powder into the surface. However, an undesirable residual coating, some of which may be referred to as "bisque" in the industry, can be difficult to remove from the cooling air holes and internal passages. "Bisque" as used herein and throughout the specification is intended to include oxidized material including scale (e.g., $Al_xO_y$); donor material constituents (e.g., halide activators and donor source materials); and by-products resulting from secondary reactions of the donor material constituents, including that of the halide-containing activator with atmospheric gases (e.g., $Al_xN_y$)—all of which are formed during the coating process and which become undesirably incorporated into the resultant aluminide coating. Bisque can cause restriction of air flow. As a result, the part must be scrapped, thereby causing material and production losses.

In another known technique, a liquid phase slurry aluminization process has been used for application of the aluminide coating. This involves directly applying the liquid phase slurry to the surface. Formation of the diffused aluminide is achieved by heating the part in a non-oxidizing atmosphere or vacuum at temperatures between 1600-2000° F. The heating melts the metal in the slurry and permits the reaction and diffusion of the aluminum into the substrate surface. However, the liquid phase slurry aluminization process suffers from the same drawbacks as the pack aluminization process. Generally speaking, both the directly applied pack and slurry pose difficulty due to the risk of fusing or sintering donor and activator to the part surface. Additionally, both techniques generate residual coating or bisque that is contained within the internal cavities and difficult to remove.

Other techniques include chemical vapor deposition (CVD) or vapor phase aluminide coating processes, whereby vaporized aluminide coating is generated external to the internal section of the part, and thereafter the vapor flow is directed into the internal sections of the part. CVD or vapor phase coatings are problematic as they require a constantly replenishing flow of aluminizing gas to the internal surface that is affected by component geometry and requires complex plumbing and gas control. Furthermore, conventional CVD and vapor phase coating processes have not proven capable of fully coating all of the required surfaces within the internal section of the part at the same rate as the external sections are being coated during a coating cycle. This can lead to uncoated surfaces. The problem of incomplete aluminide coverage along the internal sections has become even more problematic with components having increasingly complex geometries with advancement of various industry technologies, such as within the aerospace and energy sectors.

In view of the drawbacks with conventional aluminide coating processes, there is an unmet need for an aluminide coating process than can effectively coat internal surfaces with complex geometries in a simplified manner. Other advantages and applications of the present invention will become apparent to one of ordinary skill in the art.

SUMMARY OF THE INVENTION

The invention may include any of the following aspects in various combinations and may also include any other aspect of the present invention described below in the written description.

In a first aspect, a method for applying an aluminide coating is provided. The coating process comprises providing a component having an external section and an internal section. The internal section is characterized by one or more internal surfaces defining an internal cavity. An elongated member defined at least in part by a size and shape corresponding to the internal section of the component is also provided. The elongated member is applied with an aluminum-based slurry onto the elongated member. The elongated member is introduced through an opening of said component and then positioned into said cavity at a location that is spaced apart from each of the one or more internal surfaces. Heat is applied to the component and the member. Vaporized aluminum is generated within said internal section and directed towards the one or more internal surfaces. The vaporized aluminum is diffused into the one or more surfaces. The aluminum reacts with the one or more surfaces to form the aluminide coating.

In a second aspect, a method for applying an aluminide coating is provided. The coating process comprises providing a component having an external section and an internal section, in which the internal section is characterized by one or more internal surfaces defining a first internal cavity and a second internal cavity. A first elongated member is provided. The first elongated member is defined at least in part by a size and shape corresponding to the first internal cavity. A first aluminum-based slurry is applied onto said first elongated member. A second elongated member is defined at least in part by the size and shape corresponding to the second internal cavity. A second aluminum-based slurry is applied onto said second elongated member. The first elongated member is introduced into the first internal cavity. The first elongated member is positioned within said first cavity at a first location that is spaced apart from each of the one or more internal surfaces defining the first internal cavity. The second elongated member is introduced into the second internal cavity and then positioned within the second cavity at a second location that is spaced apart from each of the one or more internal surfaces defining the second internal cavity. Heat is applied to the component, the first and the second elongated members. A first vaporized aluminum and a second vaporized aluminum are generated within each of the first and second internal cavities, respectively. The first and the second vaporized aluminum are directed towards the one or more internal surfaces. The first and the second vaporized aluminum diffuse into the one or more surfaces. The first vaporized aluminum reacts with the one or more surfaces defining the first internal cavity to form a first aluminide coating. The second vaporized aluminum reacts with the one or more surfaces defining the second internal cavity to form a second aluminide coating.

In a third aspect a coating apparatus for applying an aluminizing coating onto an internal section of a component is provided. The apparatus comprises an elongated member characterized by a first end, a second end and one or more surfaces extending between the first end and the second end. The elongated member is disposed within an internal cavity of the component at a location therewithin such that the one or more surfaces do not contact any internal surfaces of the internal section to be coated. The elongated member is characterized by a size and shape corresponding to a geometry of the internal section of the component. The one or more surfaces of the elongated member are coated with an aluminum-based slurry. The slurry comprises an activator, binder and aluminum donor slurry. The one or more surfaces extend into the internal cavity of the component. The first end of the elongated member is in proximity to an opening through which the elongated member is inserted. The second end of the elongated member extends a fixture assembly. The fixture assembly is mechanically affixed to the second end of the elongated member and the component. The fixture maintains the elongated member stationary during the applying of the aluminizing coating.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein:

FIG. 2a shows an elongated member mechanically engaged to a fixture assembly;

FIG. 2b shows the apparatus of FIG. 2a in combination with a gas turbine component placed over the elongate member, in which the component is to be coated along its internal section;

FIGS. 3a, 3b and 3c shows cross-sectional micrographs of a hollow tube coated with an aluminide coating prepared by a conventional slurry phase aluminization process;

FIGS. 3d, 3e and 3f shows cross-sectional micrographs of a hollow tube coated with an aluminide coating in accordance with the principles of the present invention;

FIG. 4a shows an enlarged micrograph of FIG. 3c of a cross-sectional sample of the coated tube obtained at one of the ends of the tube;

FIG. 4b shows an enlarged micrograph of FIG. 3f of a cross-sectional sample of the coated tube obtained at one of the ends of the tube.

DETAILED DESCRIPTION OF THE INVENTION

The objectives and advantages of the invention will be better understood from the following detailed description of the preferred embodiments thereof in connection. The present disclosure relates to novel techniques for the formation of aluminide diffusion coatings onto internal sections of a component. The methods of the present invention are particularly suitable for components having complex geometries in which conventional techniques have proven unable to fully coat all required internal surfaces. The disclosure is set out herein in various embodiments and with reference to various aspects and features of the invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

The present invention will now be described in connection with FIGS. 1-5. The Figures show an improved and novel process for applying aluminide coatings. As will be explained, the process eliminates the drawbacks of conventional aluminization processes while simplifying the manner in which the coatings can be prepared. Furthermore, the present invention produces aluminide coatings possessing improved properties compared to aluminide coatings prepared by conventional aluminization processes.

Figure 1:
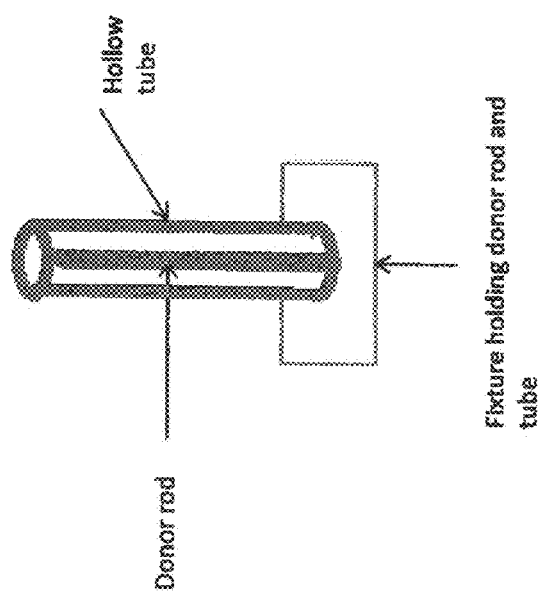
FIG. 1 shows a schematic of an aluminide coating process in accordance with the principles of the present invention.

FIG. 1 shows a general process for applying an aluminide coating onto selective internal surfaces of a component. The component shown in FIG. 1, by way of example, is a hollow tube-like structure having external and internal surfaces preferably formed from a metallic alloy such as nickel and/or cobalt. The hollow tube can be defined as having an external section and an internal section. The external section is generally applied with an aluminide coating, such as by way of example, a platinum aluminide material. The internal section of the component is applied with an alumide coating, such as simple aluminides, chrome aluminides, and modified aluminides containing elements such as Hf, Y, Zr and Si. The internal section includes one or more internal surfaces that define an internal cavity or volume. The internal section may have a complex geometry having a certain shape, size and/or surface texture pattern that conventional aluminization processes may not be able to effectively coat in its entirety.

Still referring to FIG. 1, an elongated member is shown disposed within the internal cavity of the hollow tube. The elongated member provides the source for coating the aluminide material onto the internal surfaces of the hollow tube. The elongated member has a size and shape that corresponds to the geometry of the internal section of the hollow tube. The elongated member is characterized by a first end, a second end and a curvilinear surface extending between the between the first and the second ends. As shown in FIG. 1, the elongated member is situated within the hollow tube such that the curvilinear surface does not contact any internal surfaces of the internal section of the hollow tube to be coated.

The curvilinear surface of the elongated member is shown extending through the internal cavity of the hollow tube. The curvilinear surface is applied with an aluminum-based slurry. The slurry contains the aluminum source or donor material to be coated onto the internal surfaces of the component. The aluminum-based slurry comprises an aluminum donor material, which can include, by way of example, aluminum and aluminum alloys. Examples of suitable aluminum alloys include chrome aluminum, cobalt aluminum and silicon aluminum. Preferably, the elongated member is pre-coated, dried and cured with the aluminum-based slurry prior to insertion and placement of the elongate member within the internal section of the component (e.g., hollow tube). Release and vaporization of the aluminum from the slurry is facilitated by a halide activator, as known in the art, which is included in the aluminum-based slurry. The slurry also includes a vaporizable binder to adhesively maintain the resultant coating on the internal surface of the component. The aluminum-based slurry may be applied onto the elongate member by any known means such as dipping. The slurry is preferably dried and cured at a relatively low temperature from about room temperature to about 500° F. to create the aluminum-based coating on the member.

FIG. 1 shows that the elongate member includes a first end that is situated in close proximity to the hollow tube's opening through which the elongate member is inserted. The elongate member has a second end, which is shown extending towards a fixture assembly. The fixture assembly may be engaged to the second end of the elongate member and hollow tube. In the example of FIG. 1, the fixture assembly may be mechanically affixed to the elongate member and hollow tube. After the coating cycle is completed, the fixture assembly can be detached from the elongate member and the hollow tube.

The elongated member can be made of any suitable heat resistant material such as a metal, ceramic or graphite. The member has a shape and size that allows insertion into the internal cavity of the hollow tube without abutting against any of the internal surfaces of the hollow tube to be coated. In one example, and as shown in FIG. 1, the elongated member is a rod-like structure. In another example, the elongated member is a wire. Selection of the exact shape, cross-sectional thickness and length of the member may be dependent, at least in part, on the geometry of the internal surfaces to be coated along with the thickness of the resultant aluminide coating and composition of the aluminide coating (e.g., aluminum content and gradient required in the additive coating and diffused coating.

After applying the aluminum-based slurry and then preferably drying and curing to form the corresponding aluminum-based coating (e.g., aluminum donor material, halide activator and binder), the member is inserted into the internal cavity of the hollow tube in the configuration as shown in FIG. 1. The member is positioned at a location within the internal cavity so as to not abut or contact the internal surfaces of the hollow tube to be coated. The elongated member is then secured in place by means of a fixture assembly that is preferably made of a heat resistant material. The fixture assembly ensures that the member does not move and inadvertently contact the internal surfaces during the coating cycle. The fixture assembly can be mechanically affixed to of the ends of the elongated member and the hollow tube. The fixture serves to maintain the orientation of the elongated member and prevent movement of the elongate member during an aluminide coating cycle. The fixture assembly may be detached from the hollow tube and the elongated member by any conventional means known in the art. It should be understood that other means for securing the elongated member onto a fixture may be utilized.

Having positioned and secured the elongated member as shown in FIG. 1, heat is applied to the component and elongated member. The heat may be applied by any furnace suitable for heat treating of metals in vacuum or a protective atmosphere such as hydrogen or argon. Sufficient heat is applied to establish thermal conditions that promote release and vaporization of aluminum from the coating. In one example, the temperature of the component and rod may be heated from about 1600-2000° F. The halide activator and binder are vaporized. As the volatized constituents of aluminum donor material, activator and binder are released into the interior cavity, a non-oxidizing or inert gas is preferentially used to sweep or remove at least a portion of the halide activator and binder occupying the space between the internal surfaces and the elongated member. In this manner, at least a portion of the activator and binder may be removed prior to their contact with the internal surfaces. Some of the volatized aluminum may also be swept or entrained therealong, but not to an extent that insufficient aluminum coats onto and diffuses into the internal surfaces. Precursors leading to bisque and scale formation are removed by inert gas during the coating cycle and/or remain on the elongated member. In this manner, significantly cleaner coating vapors are directed toward the part surface.

The vaporized aluminum donor material is directed towards the internal surfaces of the hollow tube. Upon reaching the internal surface, a portion of the aluminum is diffused into the internal surface and another portion may deposit onto the internal surface, thereby creating an additive layer. The aluminum can react with the metallic alloys to form the aluminide coating. The aluminum is also interdispersed with the metallic alloys of the substrate or part. After completion of the coating cycle, the fixture may be detached from the hollow tube and the elongated member.

It should be understood that the present invention contemplates coating various types of components. For example, a hollow turbine vane as shown in FIGS. 2a and 2b can be coated utilizing the coating method and apparatus as generally described with FIG. 1. Still further, more complicated geometries can be coated with the method of the present invention. Applicants have surprisingly discovered that the approach of the present invention can uniformly coat various intricate patterns, shapes, and sizes along the internal surface not previously possible with conventional aluminization techniques. Conventional techniques have typically not been reliable in ensuring all surfaces are coated.

Furthermore, and as will be described in the working examples below, the resultant aluminide coatings produced in accordance with the principles of the present invention exhibit less variation in thickness, less variation in aluminide content and elimination or significantly less inclusion of surface oxides (i.e., scale and oxidation of other foreign matter originally on part surface) and bisque in comparison to the aluminide coatings prepared by conventional techniques. As will be discussed in the Examples, it has been found that the present invention can eliminate post-coating steps which require removal of bisque and scale. The reduction in surface oxides and bisque may translate into higher performance aluminide coatings with improved corrosion, oxidation and thermal shock resistance. The precise mechanism by which the improvements are occurring is not known with certainty. However, without being bound by any theory, the improvements may be attributed to the aluminum donor material, activator and binder not being in direct contact with the surfaces to be coated during the coating cycle. In this manner, subsequent removal of some of the activator and binder may appear to suppress surface oxide growth within the resultant coating along with any fusing or sintering of donor and activator to the internal surface, commonly referred to as "bisque" in the industry. Advantageously, the present invention does not remove aluminum to create low aluminum content in the coating.

In another embodiment of the present invention, the method may involve utilizing dedicated elongated members to coat two or more separately defined internal sections of a single component. By way of example, many turbine vanes may include two or more internal sections requiring aluminide coatings with different thicknesses. The present invention can be utilized to coat each of the internal sections with a separate elongated member that is coated with its own unique aluminum-based slurry. In this manner, the internal sections can be independently coated utilizing different processes to form different resultant coatings during a single coating cycle.

The present invention includes various other embodiments. For example, the chemical composition of the coating for the elongated member can be modified to produce aluminide coatings of different thickness and chemical composition, such as aluminum-chrome and cobalt aluminum. Compounds containing lithium, ammonium, and aluminum as cations and chlorine and fluorine as anions may be employed as activators.

The examples below demonstrate the unexpected improvements in both the process and resultant aluminide coating of the present invention in comparison to conventional techniques currently employed by the industry.

Comparative Example 1 (Direct Applied Slurry Aluminization for Hollow Tube)

Tests were performed to apply an aluminide coating onto the internal surfaces of a hollow cylindrical tube. A representative schematic of the tube is shown in FIG. 1. The tube was formed from grade 304 stainless steel. The tube was 48 inches in length and had a diameter of 2 inches. The aluminum-based slurry that was applied onto the hollow tube was SermAlcote™ 2525 slurry aluminide, which is commercially made and sold by Praxair Surface Technologies, Inc. The slurry was applied directly onto the internal surfaces of the hollow tube. The slurry and hollow tube were heat treated in a bell retort furnace for 1975° F. for 4 hours in an argon atmosphere. The heat treatment allowed the reaction and diffusion of the aluminum into the internal surfaces of the tube.

Cross-sectional samples of the coated internal surfaces were obtained at different lengths of 6 inches, 24 inches and 42 inches as measured from one of the ends of the tube. As part of the coating procedure and as well-known in the art, a nickel plated top layer was added to each sample to allow evaluation. The results are shown in FIGS. 3a, 3b and 3c. The micrographs show surface oxide inclusions within the coatings at 24 inches and particularly at 42 inches. The inclusions were observed to be oxides originally believed to be present on the part surface as well as other foreign matter not intended to be incorporated into the resultant coating. Additionally, bisque was also detected at the outer layer for each of the samples. These results show that post-cleaning steps would be required to remove the oxide inclusions and the bisque residues. The slides of FIGS. 3a, 3b and 3c show significant variation in coating thickness along the length of the tube at 6 inches, 24 inches and 42 inches.

FIG. 4a shows an enlarged view of the cross-sectional sample at 42 inches to illustrate the deleterious scale and bisque which is produced by conventional by direct application of the aluminide-based slurry.

Comparative Example 2 (Vapor Phase Aluminization for Turbine Vane)

Two trials were performed to apply an aluminide coating onto the internal surfaces of a gas turbine vane. A representative schematic of the gas turbine vane is shown in FIG. 2b. The coating was applied by a standard vapor phase aluminization (VPA) procedure using vaporized SermAlcote™ 2525 aluminide.

Vaporized aluminide coating was generated external to the internal section of the vane. The vapor flow was then directed into the internal sections of the vane. Continuous replenishment of the flow of aluminizing gas to the internal surface was required.

Figure 5:
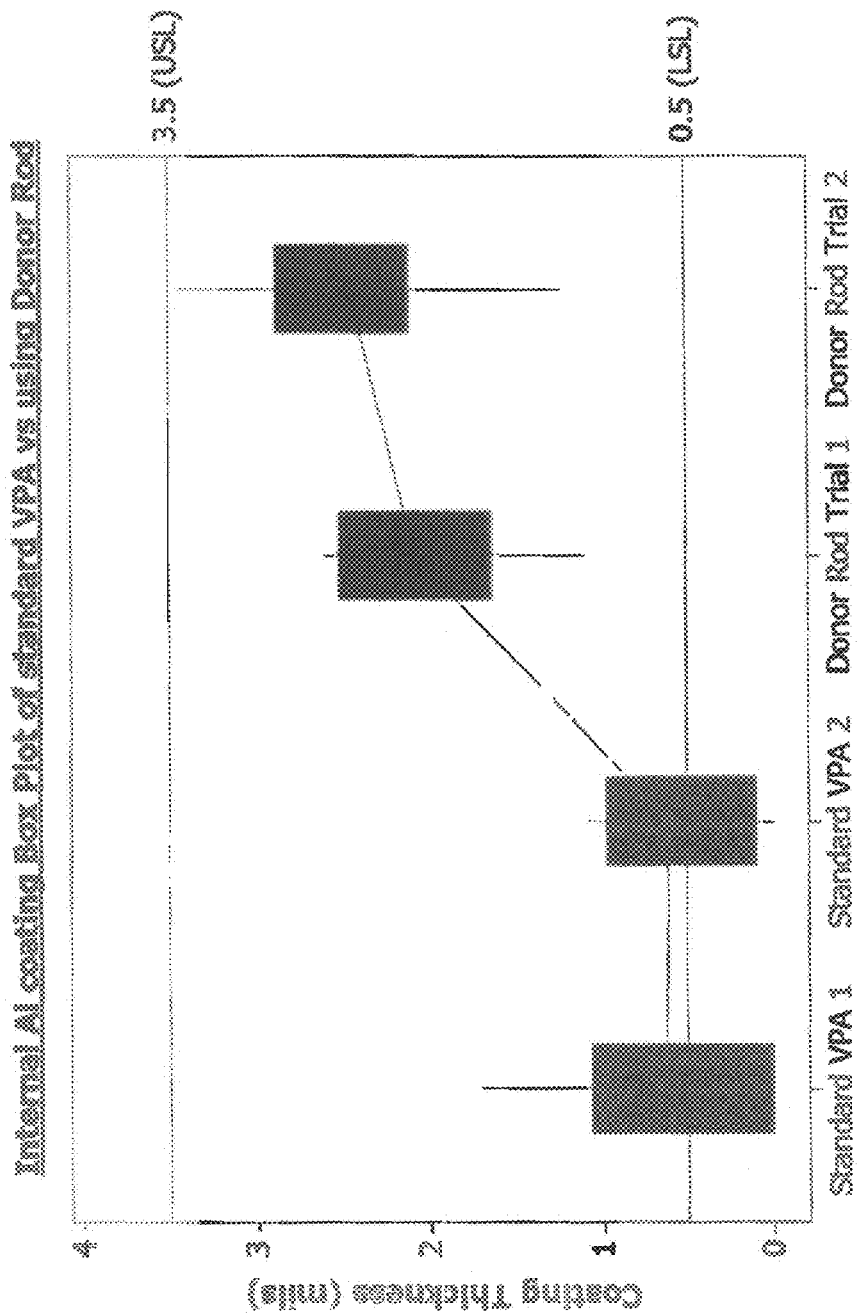
FIG. 5 shows a comparison of thickness distributions for aluminide coated gas turbine vanes coated by a standard vapor phase aluminization process and coating method of the present invention.

Cross-sectional samples of the coated internal surfaces were obtained in the manner as previously described in Comparative Example 1. Additionally, coating thickness (mils) was evaluated. Samples were taken at three cross-sections of the vane: one sample from the middle and one sample from each of the ends. Eight measurements were taken from each of the samples at specific evenly spaced locations therewithin. The coating thickness measurements for each of the two trials were summarized by the boxplots designated Standard VPA1 and Standard VPA2 as shown in FIG. 5. Minitab™ statistical software was used to generate the box plots. The box represents the middle 50% of all thickness measurements that were sampled. For each of the trials, a significant portion of the coating thickness measurements fell below the lower limit line (LSL) of 0.5, which represents a typical industry allowance for internal coating thicknesses. Post-cleaning steps would be required for their respective removal.

Example 1 (Indirect Slurry Rod Method for Coating Hollow Tubes)

Tests were performed to apply an aluminide coating onto the internal surfaces of a hollow cylindrical tube. The tube was identical to the one coated in Comparative Example 1. A representative schematic of the tube is shown in FIG. 1. The tube was formed from grade 304 stainless steel. The tube was 48 inches in length and had a diameter of 2 inches.

A cylindrical shaped elongated member of grade 304 stainless steel was coated with SermAlcote™ 2525 slurry aluminide. The member was dipped into the slurry to produce a film thickness of approximately 0.01 inches. The member was cured at 250° F. for 1 hour. The coated member was placed inside the hollow tube and positioned so as to not contact the walls of the tube. A heat-resistant metal fixture was configured at each end of the tube to maintain the tube in a fixed position during the coating cycle.

The coating assembly was then introduced into a bell retort furnace. The coating and hollow tube were heat treated in the bell retort furnace for 1975° F. for 4 hours in an argon atmosphere. The heat treatment allowed the reaction and diffusion of the aluminum into the internal surfaces of the tube. After cooling, the coating assembly was removed from the retort and disassembled.

Cross-sectional samples of the coated internal surfaces were obtained at different lengths of 6 inches, 24 inches and 42 inches as measured from one of the ends of the tube. As part of the coating procedure and as well-known in the art, a nickel plated top layer was added to each sample to allow evaluation. The results are shown in FIGS. 3d, 3e and 3f. In comparison to FIGS. 3a-3c of Comparative Example 1, the micrographs show less surface oxide inclusions and less bisque. Unlike Comparative Example 1, the coating samples of FIGS. 3d-3f would require post-cleaning steps to remove the bisque and scale. The slides of FIGS. 3d, 3e and 3f show less variation in coating thickness in comparison to the micrographs from Comparative Example 1.

FIG. 4b shows an enlarged view of the cross-sectional sample at 42 inches to illustrate the significant reduction in deleterious scale and bisque.

Example 2 (Indirect Slurry Rod Method for Coating Turbine Vane)

Two trials were performed to apply an aluminide coating onto the internal surfaces of a gas turbine vane having a geometry identical to that of Comparative Example 2. The coating material was SermAlcote™ 2525 aluminide.

A stainless steel wire was coated with SermAlcote™ 2525 slurry aluminide. The wire had a diameter of 0.125 inches. The wire was dipped into the slurry to produce a film thickness of approximately 0.01 inches. The wire was cured at 250° F. for 1 hour. Next, the turbine vane was placed over the rod. A heat-resistant graphite fixture was configured to maintain the tube in a fixed position during the coating cycle. The coated wire was positioned so as to not contact the walls of the vane.

The coating assembly was then introduced into a bell retort furnace. The coating and hollow tube were heat treated in the bell retort furnace for 1975° F. for 6 hours in an argon atmosphere. Aluminum vaporized from the slurry coated wire and then flowed towards the internal surfaces, where it diffused and reacted to form the aluminide coating. After cooling, the coating assembly was removed from the retort and disassembled.

Cross-sectional samples of the coated internal surfaces were obtained in the manner as previously described in Example 1. Additionally, coating thickness (mils) was evaluated. Samples were taken at three cross-sections of the vane: one sample from the middle and one sample from each of the ends. Eight measurements were taken from each of the samples at specific evenly spaced locations therewithin. The coating thickness measurements for each of the two trials were summarized by the boxplots designated Donor Rod Trial 1 and Donor Rod Trial 2 as shown in FIG. 5. Minitab™ statistical software was used to generate the box plots. The box represents the middle 50% of all thickness measurements that were sampled. For each of the trials, all of the coating thickness measurements were within the lower limit line (LSL) of 0.5 and upper limit of 3.5 (USL), both of which represent a typical industry allowance for internal coating thicknesses. The samples of Example 2 showed a statistically significant step change in coating thickness that is an improvement over conventional vapor phase technology for aluminide coatings as shown in Comparative Example 2.

The samples were observed to have no bisque and scale and none of the cooling holes were inadvertently clogged with coating. Post-cleaning steps would not be required for their respective removals.

As has been shown, the present invention offers a unique coating method and apparatus for preparing diffusion aluminide coatings on various parts, including those parts having complex geometries. Advantageously, the present invention substantially reduces or eliminates the risk of sintering or fusing materials, such that bisque and scale do not remain in the coated part when the elongated wire or rod-like structure is removed after the coating cycle. The precursors for formation of bisque and scale are removed by inert gas during the coating cycle and/or remain on the elongated member. In this manner, significantly cleaner coating vapors are directed toward the part surface.

In addition to the ability to produce higher purity coatings, the inventive coating process is simplified due to ease of application and the flexibility of process. There is no need for physical flushing and chemical neutralization of the coating materials that is typically required after conventional coating cycles. The present invention also enables reduction of material usage and waste by virtue of eliminating or reducing bisque and scale formation.

The present invention can also coat complex geometries that typically have not been readily coated with vapor phase or CVD processes. Additionally, large parts can be coated, as is not always feasible with conventional aluminide technologies.

The present invention as described in the various embodiments and Examples can be used independently or in conjunction with any of the above mentioned aluminizing technologies. For example, a hollow tube could be coated internally with a aluminide coated elongate wire or rod in the same vapor phase coating cycle for coating the external surface. The ability to concurrently coat the internal and external sections of a component or part during a single coating cycle offers numerous additional process benefits, such as increased throughput and reduced material consumption and operational costs.

The coating apparatus employed to carry out the inventive methods as described herein can be constructed from industry standard heat treat furnaces and simplified tooling, thereby reducing material costs for assembly.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A method for applying an aluminide coating, comprising:
providing a component having an external section and an internal section, said internal section characterized by one or more internal surfaces defining an internal cavity;
providing an elongated member defined at least in part by a size and shape corresponding to the internal section of the component;
applying an aluminum-based slurry onto said elongated member;
introducing said member through an opening of said component;
positioning said member within said cavity at a location that is spaced apart from each of the one or more internal surfaces;
applying heat to the component and the member;
generating vaporized aluminum within said internal section;
directing the vaporized aluminum towards the one or more internal surfaces;
diffusing vaporized aluminum into the one or more surfaces; and
reacting the aluminum with the one or more surfaces to form the aluminide coating.

2. The method of claim 1, further comprising the step of maintaining the elongated member in a stationary configuration.

3. The method of claim 1, further comprising removing the elongated member after formation of the aluminide coating.

4. The method of claim 1, wherein said external section is coated during formation of said aluminide coating along the one or more internal surfaces of the internal section of the component.

5. The method of claim 1, wherein said aluminum-based slurry comprises a halide activator and a binder each of which is in a volatized state after the step of applying heat to the component and the member.

6. The method of claim 5, wherein at least a portion of said volatized binder and volatized halide activator are removed from the internal cavity prior to said binder and activator contacting said one or more internal surfaces.

7. The method of claim 1, wherein said aluminum-based slurry comprises an aluminum donor material, said aluminum donor material selected from the group consisting of aluminum and aluminum alloys.

8. The method of claim 7, wherein said aluminum alloys are selected from the group consisting of chrome aluminum, cobalt aluminum and silicon aluminum.

9. The method of claim 1, wherein said elongated member is coated with the aluminum-based slurry prior to the introduction of said member into the component.

10. The method of claim 9, wherein said slurry is cured to form an aluminum-based coating.

11. The method of claim 1, wherein said elongated member does not make contact with any of the one or more internal surfaces during formation of the aluminide coating.

12. A method for applying an aluminide coating, comprising:
providing a component having an external section and an internal section, said internal section characterized by one or more internal surfaces defining a first internal cavity and a second internal cavity;
providing a first elongated member defined at least in part by a size and shape corresponding to the first internal cavity;
applying a first aluminum-based slurry onto said first elongated member;
providing a second elongated member defined at least in part by the size and shape corresponding to the second internal cavity;
applying a second aluminum-based slurry onto said second elongated member;
introducing said first elongated member into said first internal cavity;
positioning said first member within said first cavity at a first location that is spaced apart from each of the one or more internal surfaces defining the first internal cavity;
introducing said second elongated member into the second internal cavity;
positioning said second elongated member within said cavity at a second location that is spaced apart from each of the one or more internal surfaces defining the second internal cavity;
applying heat to the component, the first and the second elongated members;
generating a first vaporized aluminum and a second vaporized aluminum within each of said first and second internal cavities, respectively;

directing the first and the second vaporized aluminum towards the one or more internal surfaces;

diffusing the first and the second vaporized aluminum into the one or more surfaces; and reacting the first vaporized aluminum with the one or more surfaces defining the first internal cavity to form a first aluminide coating; and reacting the second vaporized aluminum with the one or more surfaces defining the second internal cavity to form a second aluminide coating.

13. The method of claim 12, wherein said first aluminide coating is produced at a first rate having a first thickness, and said second aluminide coating is produced at a second rate having a second thickness.

14. The method of claim 12, further comprising a step of maintaining each of said first and second elongated members in a fixed configuration during production of the first and the second aluminide coatings.

15. The method of claim 12, wherein said first and second members do not make contact with any of the internal surfaces during production of the first and the second aluminide coatings.

16. The method of claim 12, further comprising withdrawing the first elongated member and the second elongated member after formation of the first and the second aluminide coatings.

17. The method of claim 12, wherein said formation of said first aluminide coating on said first internal cavity and formation of said second aluminide coating on said second internal cavity occurs during coating of the external section.

18. The method of claim 12, wherein said first aluminum-based slurry comprises a first halide activator and a first binder, and wherein said second aluminum-based slurry comprises a second halide activator and a second binder.

19. The method of claim 18, wherein each of said first binder and first halide activator volatizes, and each of said second binder and second halide activator volatizes.

20. The method of claim 19, wherein at least a portion of said first volatized binder and said first volatized halide activator are removed from the first internal cavity prior to contact of the internal surfaces of the first internal cavity, and further wherein at least a portion of said second volatized binder and said second volatized halide activator are removed from the second internal cavity prior to contact of the internal surfaces of the second internal cavity.

* * * * *